United States Patent [19]

Noguchi

[11] Patent Number: 5,652,523
[45] Date of Patent: Jul. 29, 1997

[54] STRUCTURE OF IC DEVICE INTERFACE UNIT

[75] Inventor: Kouji Noguchi, Gyoda, Japan

[73] Assignee: Advantest Corporation, Tokyo, Japan

[21] Appl. No.: 628,979

[22] Filed: Apr. 8, 1996

[30] Foreign Application Priority Data

Apr. 7, 1995 [JP] Japan ................................. 7-108016

[51] Int. Cl.⁶ .................................. G01R 1/02; H01R 9/09
[52] U.S. Cl. ............................................ 324/755; 324/761
[58] Field of Search ................................. 324/754, 755, 324/761, 72.5; 439/68, 69, 70, 268, 269.1, 525, 526; 73/865.9

[56] References Cited

U.S. PATENT DOCUMENTS

| | | | |
|---|---|---|---|
| 3,701,079 | 10/1972 | Bowden et al. | 439/526 |
| 4,713,022 | 12/1987 | Pfaff | 439/526 |
| 4,950,980 | 8/1990 | Pfaff | 324/755 |
| 4,984,991 | 1/1991 | Nishimoto | 439/525 |
| 5,443,404 | 8/1995 | Matsuoka | 439/70 |
| 5,485,096 | 1/1996 | Aksu | 324/754 |

*Primary Examiner*—Vinh P. Nguyen
*Attorney, Agent, or Firm*—Knobbe, Martens, Olson & Bear, LLP

[57] ABSTRACT

An IC device interface unit increases a number of IC devices to be tested at the same time by a semiconductor test system without increasing an overall size of the interface unit. The IC device interface unit includes a pair of IC sockets for receiving IC devices to be tested wherein the IC sockets have a standard size defined in the industry, a sub-socket board for mounting the IC sockets on one surface by receiving contact leads projected from the IC sockets, a pair of terminal connectors to be mounted on the other surface of the sub-socket board wherein the terminal connectors have contact leads at both ends and one ends of which are connected to the sub-socket board, a socket board for receiving other ends of the terminal connector at one surface of the socket board, a pair of connect boards to be electrically connected to other surface of the socket board wherein the connect boards have contact leads at both ends and one ends of which are connected to the socket board and the other ends of which are connected to a performance board of the test head, and a sub-socket board spacer positioned between the sub-socket board and the socket board for providing a space for the terminal connector.

9 Claims, 3 Drawing Sheets

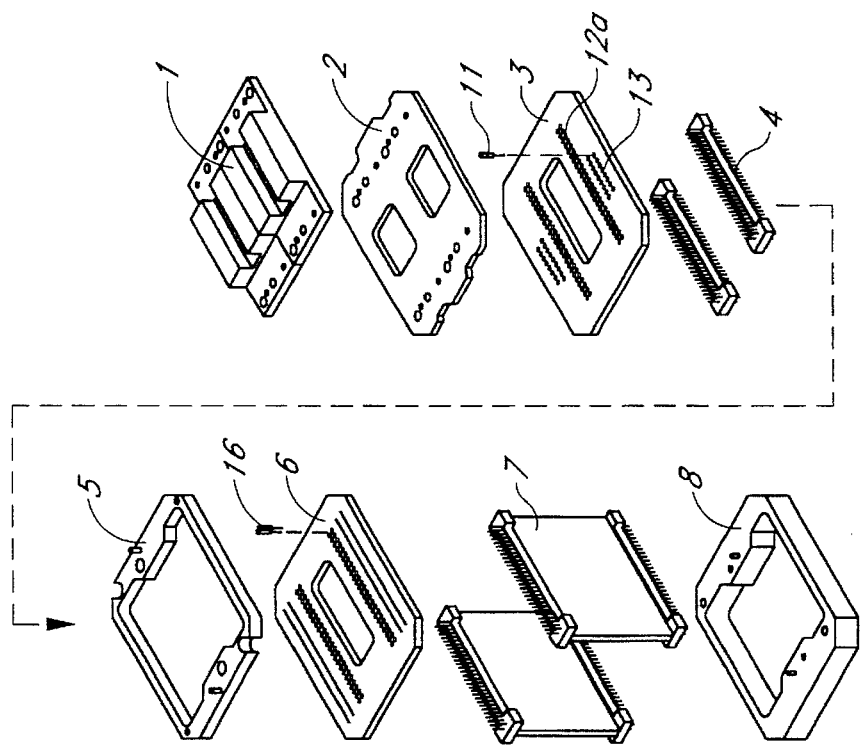
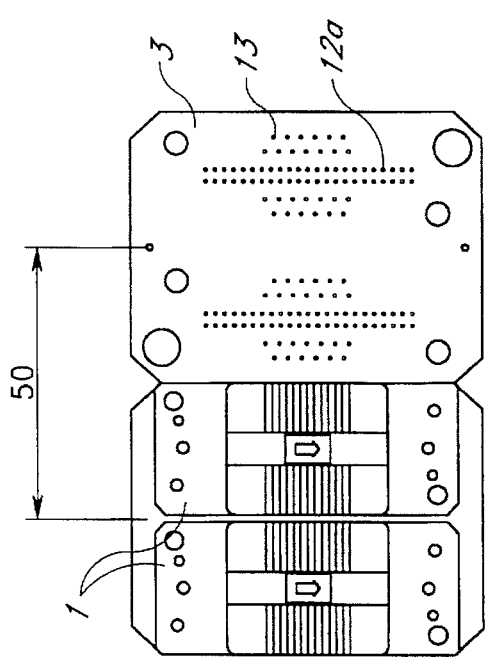
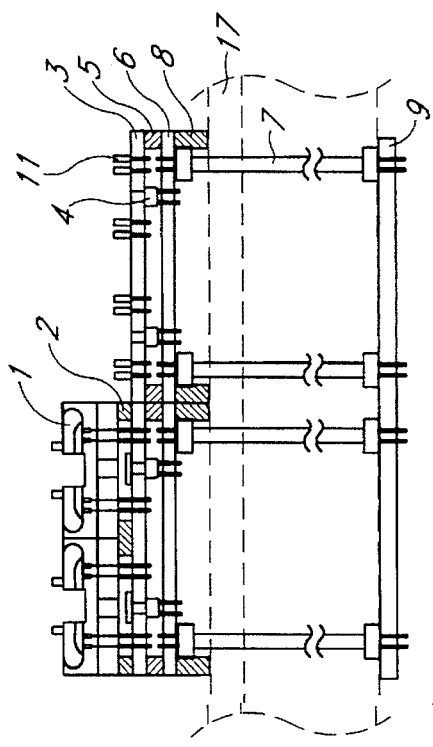
FIG. 1C
FIG. 1A
FIG. 1B

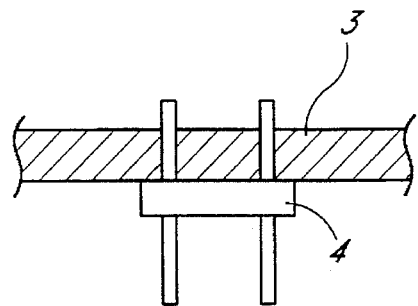
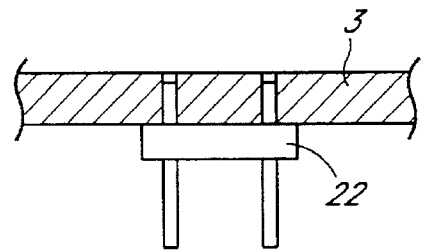
FIG.2A  FIG.2B
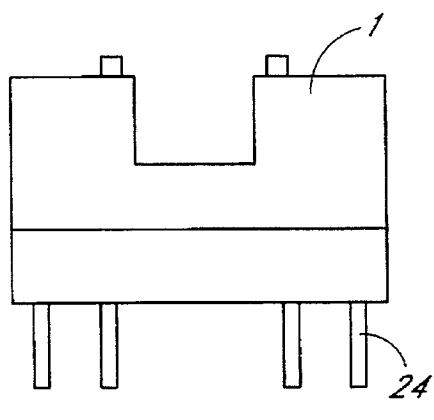
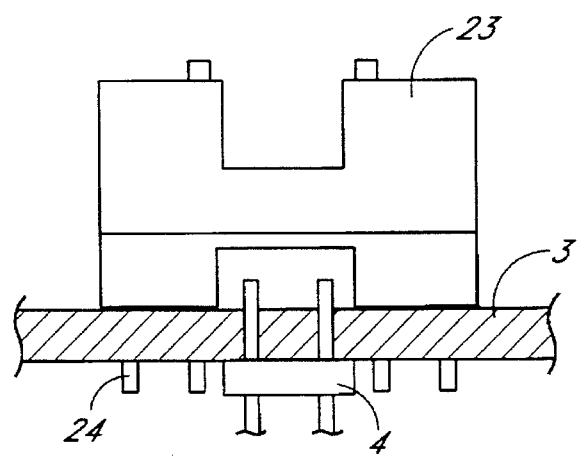
FIG.3A  FIG.3B

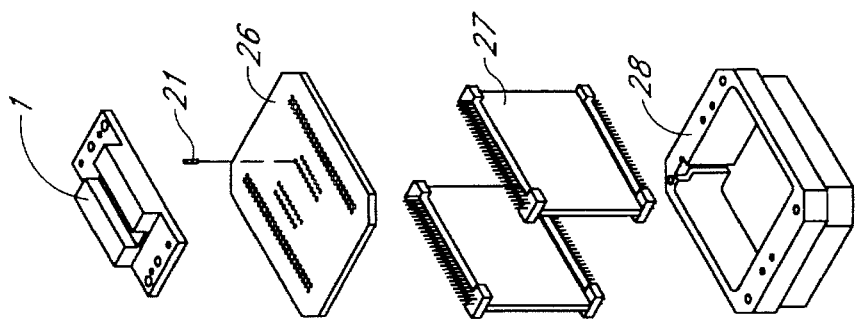
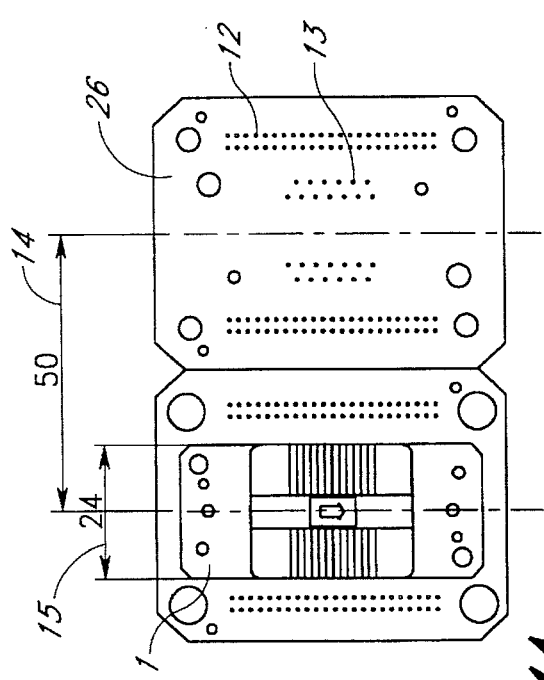
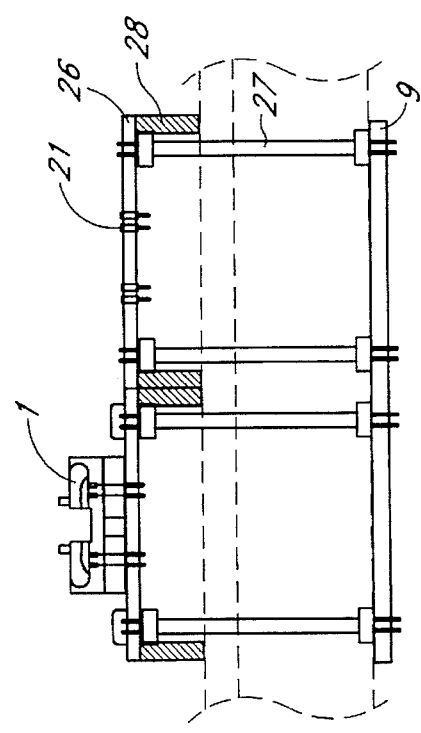
FIG. 4C
FIG. 4A
FIG. 4B

STRUCTURE OF IC DEVICE INTERFACE UNIT

FIELD OF THE INVENTION

This invention relates to a structure of an IC device interface unit for a semiconductor test system, and more particularly, to a structure of IC device interface unit which increases the density of the IC device interface for simultaneously testing a large number of IC devices by the semiconductor test system.

BACKGROUND OF THE INVENTION

In testing an IC device by a semiconductor test system having a test head, an electorial connection needs to be established between the lead pins of the IC device to be tested and the test head. The test head is a part of the semiconductor test system and has a plurality of test channels each of which provides test signal to the corresponding lead pin of the IC device under test and compares the resulting output of the IC device with the expected signal produced by the test system to determine whether the IC device functions correctly or not.

In general, the connection between the IC device and the test head is made through electrically connecting an IC socket which receives the IC device to be tested and a performance board which is attached to the test head. For such a connection method, either a cable-end method or a direct-docking method is used. In the cable-end method, wires are used to connect between the IC socket and the performance board while the direct-docking method, connect boards are used to connect between the IC socket and the performance board.

In the semiconductor industry, the higher functionality and speed of the IC devices and the requirements of minimizing an overall size of the test system while increasing the test efficiency are strongly demanded. Under the circumstances, the above mentioned direct docking-method is thought to be the more advantageous method than the cable-end method.

The reason that the direct-docking method is advantageous is that the test signal paths route can be minimized, thereby signal degradation involving an ultra-high frequency testing can be avoided. Also, this method can easily cope with the change in the kinds of IC devices to be tested. The connection structure accomplished by the direct-docking method is called an IC device interface unit, which is the subject matter of the present invention.

FIG. 4 shows the structure of an IC device interface unit of the conventional technology. FIGS. 4A and 4B respectively show the structures of two IC device interface units aligned adjacent with each other for the convenience of explanation. It should be noted that in the actual semiconductor test system, a large number of such IC device interface units, for example 32 units, are aligned to test 32 IC devices at the same time. FIG. 4A is a plan view and FIG. 4B is a cross sectional view of the IC device interface units. FIG. 4C is an exploded view showing all the components which comprise the interface unit.

In FIG. 4, IC sockets 1 are mounted on corresponding socket boards 26. The IC sockets 1 receive IC devices to be tested which are aligned on a test tray (not shown) when the test tray descends to the IC device interface units. The IC sockets 1 are standard sockets available in the market so that they can receive the IC devices which also seized in accordance with the industry standard. In this example, the width of the IC socket is 24 mm. A handling pitch 14 between the interface units is 50 mm.

The IC socket has a plurality of contact leads (not shown) underneath and each of the contact leads is received by a pin connector 21 mounted on a corresponding conductive land (printed electrode) on the socket board 26. The conductive lands are designated by numeral 13 each of which usually has a through hole for attachment of the pin connector 21. The pin connector 21 has an elastic structure to assure an electric contact between the contact lead of the IC socket 1 and the socket board 26 when the IC socket 1 is mounted on the board 26.

A pair of connect boards 27 are provided under the socket board 26. Typically, the connect board 27 is a printed circuit board having connect pins at both ends as shown in FIG. 4. The connect pins of the connect board 27 are inserted in the corresponding through holes provided on conductive lands 12 of the socket board 26. The conductive lands 13 and 12 are electrically connected in the socket board 26. Thus, the electric connection between the IC socket 1 and the connect boards 27 is established when the board 27 are mounted on the board 26.

The other ends of the connect board 27 are mounted on a performance board 9 which is placed on the test head (not shown) of the semiconductor test system. The connect pins on the connect board 27 are inserted in through holes of the performance board 9. Thus, the electric connection between the IC device to be tested which will be inserted in the IC socket 1 and the performance board 9 will be established when the test tray is placed over the IC device interface units to initiate the IC device testing.

A board space 28 mechanically connects the performance board 9 and socket board 26 through a support frame 17. The support frame 17 also provides an electrical common ground for the IC device interface units. The board spacer 28 also functions to prevent a dry air escaping therefrom. The dry air is provided in the board space 28 to keep the atmosphere of the IC devices in low humidity when the IC device under test is evaluated under the low and high temperature environment formed by an automatic test handler (not shown) which transfers the IC devices on the test tray to the IC device interface units.

In the foregoing conventional structure, however, because of the strong demand for increasing productivity, the number of IC devices to be handled at same time is not sufficient to meet the recent development in the automatic handler and associated test trays. For example, the above conventional structure can handle 32 IC devices in parallel at the same time. However, it is requested that larger number of IC devices, for example, 64 IC devices be tested at the same time. The test trays which can align 64 IC devices have already been used in the semiconductor test system. In the conventional IC device interface units, 64 IC devices aligned in the test tray are tested by a first step in which 32 IC devices are evaluated and a second step in which remaining 32 IC devices are evaluated by shifting the test tray by the handling space 14 of FIG. 4A.

Therefore, there is a need of IC device interface units which can increase the number of IC devices handled at the same time while using the standard size IC sockets. For example, since 64 IC devices are stored in the typical test tray used in the modern semiconductor test system as noted above, there is a special need of establishing a structure of IC device interface units which can handle 64 IC devices at the same time.

SUMMARY OF THE INVENTION

Therefore, it is an object of the present invention to provide a unit structure for IC device interface unit which is capable of increasing the number of IC devices to be tested at the same time.

It is another object of the present invention to provide a unit structure for IC device interface unit which is easily replaceable in accordance with the changes in the kinds of IC devices to be tested.

It is a further object of the present invention to provide a unit structure for IC device interface unit which is capable of increasing the number of IC devices to be tested at the same time using the standard size IC sockets available in the market.

It is a further object of the present invention to provide a unit structure for IC device interface unit which is capable of increasing the number of IC devices to be tested at the same time without increasing the overall size of the interface units.

It is a further object of the present invention to provide a unit structure for IC device interface unit which is capable of handling 64 IC devices at the same time.

To accomplish the above objectives, the unit structure of the IC device interface unit of the present invention is placed attentions to the following points:

(1) To take over the structure which is well established as the conventional technology and can easily cope with the improvement, which is one of the advantages of the cableless (direct-docking) IC device interface unit.

(2) For the above purpose, the IC socket which is conveniently priced for mass production in the market and used as the standard in the industry should be used in the present invention as well.

(3) IC devices to be tested are stored with the corresponding alignment of IC devices on the test tray which has double the number of IC devices while the overall size corresponding to the test tray remains the same.

The IC device interface unit of the present invention is to provide an electric connection between a test head of a semiconductor test system with IC devices to be tested carried by a test tray. In the present invention, the IC device interface unit includes a pair of IC sockets for receiving IC devices to be tested wherein the IC sockets have a standard size defined in the industry, a sub-socket board for mounting the IC sockets on one surface by receiving contact leads projected from the IC sockets, a pair of terminal connectors to be mounted on the other surface of the sub-socket board wherein the terminal connectors have contact leads at both ends and one ends of which are connected to the sub-socket board, a socket board for receiving other ends of the terminal connector at one surface of the socket board, a pair of connect boards to be electrically connected to other surface of the socket board wherein the connect boards have contact leads at both ends and one ends of which are connected to the socket board and the other ends of which are connected to a performance board of the test head, and a sub-socket board spacer positioned between the sub-socket board and the socket board for providing a space for the terminal connector.

According to the present invention, two IC sockets can be positioned in the same area size as the conventional IC device interface unit. Thus, the unit structure for IC device interface of the present invention can increase the number of IC devices to be tested at the same time. As a result, the test efficiency in the semiconductor device testing is remarkably improved.

Further, since the IC device interface unit structure of the present invention is assembled as a unit, it is easily replaceable when changing the kinds of IC devices to be tested. The IC device interface unit structure of the present invention utilizes the standard sized IC sockets available in the market. Therefore, other parts of the semiconductor test system can remain unchanged while increasing the test efficiency.

Since the IC device interface unit of the present invention improves the density of the IC sockets by two times, the overall size of the interface unit is unaffected by this improvement. The unit structure for IC device interface of the present invention can handle 64 IC devices at the same time with 25 mm pitch compared to 32 devices with 50 mm pitch in the conventional technology.

BRIEF DESCRIPTION OF THE DRAWINGS

FIGS. 1A–1C show a structure of the preferred embodiment of the IC device interface unit of the present invention. FIG. 1A is a plan view, FIG. 1B is a cross sectional view and FIG. 1C is an exploded view showing the all components comprising the present invention.

FIGS. 2A–2B are cross sectional views showing an improvement of structure of the terminal connector of the second present invention.

FIGS. 3A–3B are a cross sectional views showing an improvement of structure of the IC socket of the present invention.

FIGS. 4A–4C show a structure of the conventional technology of the IC device interface unit. FIG. 4A is a plan view, FIG. 4B is a cross sectional view and FIG. 4C is an exploded view showing all of the components comprising the conventional interface unit.

DETAILED DESCRIPTION OF THE PREFERRED EMBODIMENTS

The preferred embodiments of the present invention will be explained with reference to the drawings.

FIG. 1 shows the structure of the IC device interface unit of the present invention. FIG. 1A is a plan view, and FIG. 1B is a cross sectional view of the IC device interface unit. FIG. 1C is an exploded view showing all of the components comprising the IC device interface unit of the present invention. Although only two unit structures are shown in FIG. 1, it should be noted that in the actual semiconductor test system, a large number of such IC device interface units are aligned to test IC devices at the same time. FIGS. 2 and 3 are schematics showing cross sectional views of the variations of the present invention.

FIGS. 1A–1C show a situation where the number of IC devices to be tested at the same time by the semiconductor test system is increased to 64 per test tray instead of 32 in the conventional structure of FIGS. 4A–4C. Thus, the handling pitch between the two adjacent is 25 mm in FIG. 1 rather than 50 mm of FIG. 4. Hence, the other structure of the IC device interface unit are also arranged to meet this requirements.

The IC socket 1 is the one generally available in the marketed and used in the conventional structure as well. Generally, the other components of the IC device interface unit are reduced in size to realize the high density of IC sockets in the same area size as the prior art.

In FIGS. 1A–1C, two IC sockets 1 are mounted on a sub-socket board 3. The IC sockets 1 receive IC devices to be tested which are aligned on a test tray (not shown) when the test tray descends to the IC device interface units. The IC sockets 1 are standard sockets available in the market so that they can receive the IC devices which also seized in accordance with the industry standard. In this example, like the example of FIGS. 4A–4C, the width of the IC socket is 24 mm. However, unlike FIG. 4, a handling pitch between the adjacent IC sockets is 25 mm.

The IC socket has a plurality of contact leads (not shown) at the bottom and each of the contact leads is received by a pin connector 11 mounted on a corresponding conductive land (printed electrode) on the sub-socket board 3. The conductive lands on the sub-socket board 3 are designated by numeral 13 each of which usually has a through hole for attachment of the pin connector 11. In this example, two sets of the conductive lands 13 are provided on the sub-socket board 3 corresponding to the two IC sockets 1. The pin connector 11 has an elastic structure to assure an electric contact between the contact lead of the IC socket 1 and the sub-socket board 3 when the IC socket 1 is mounted on the sub-socket board 3.

Also provided on the sub-socket board 3 are two sets of conductive lands $12_a$ for electrically connecting terminal connectors 4. The conductive lands $12_a$ have corresponding numbers of through holes to receive the terminal connectors 4. In this example, the terminal connectors 4 will be inserted in the through holes of the lands $12_a$ from the underside of the sub-socket board 3. The pitch between the adjacent two conductive lands $12_a$ is 1.6 mm compared to the conventional pitch of FIGS. 4A–4C is 2.54 mm. The conductive lands 13 and $12_a$ are electrically connected in the sub-socket board 3 with respect to the corresponding IC socket 1. Thus, the electric connection between the IC socket 1 and the terminal connector 4 is established when the corresponding set of the IC socket 1 and the terminal connector 4 are mounted on the sub-socket board 3.

Preferably, a socket spacer 2 is provided between the IC sockets 1 and the sub-socket board 3. In this example, the socket spacer 2 has two windows to secure spaces for avoiding top ends of the contact leads of the terminal connectors 4 appearing on the upper surface of the sub-socket board 3 from contacting the IC sockets 1. As will be described later, the socket spacer 2 can be eliminated by using shorter contact leads for the terminal connectors 4 or proving a groove at the bottom of the IC socket.

Each of the terminal connectors 4 also has a plurality of contact leads at the bottom to be electrically connected to a socket board 6. The socket board 6 is provided a plurality of conductive lands to receive the terminal connectors 4 through pin connectors 16. The pin connector 16 has an elastic structure to assure an electric contact between the contact lead of the terminal connector 4 and the socket board 6 when the terminal connector 4 is mounted on the socket board 6.

A sub-socket board spacer 5 is provided between the sub-socket board 3 and the socket board 6 to secure an enough mechanical space for the pin connectors 16 and the terminal connectors 4 between the boards 3 and 6. The sub-socket board spacer 5 is designed so that the upper contact leads of connect boards 7 will not touch and interfere with the bottom of the sub-socket board 3. The sub-socket board spacer 5 also mechanically connects the socket board 6 and the sub-socket board 3, and at the same time, a space through which the dry air escapes can be filled in.

The socket board 6 has two sets of conductive lands for the corresponding IC sockets 1. Each set of conductive lands has through holes to receive the terminal connector 4 through the pin connectors 16 and through holes to connect a connect board 7 at the bottom of the socket board 6.

A pair of connect boards 7 are provided under the socket board 6. Typically, the connect board 27 is a printed circuit board having connect pins at both ends as shown in FIG. 1. The connect pins of the connect board 7 are inserted in the corresponding through holes provided on conductive lands of the socket board 6. The conductive lands for receiving the terminal connector 4 and the conductive lands for receiving the connect board 7 are electrically connected in the socket board 6. In this example, the pitches of the conductive lands of socket board 6 and the contact leads of connect board 7 are 1.6 mm. The electric connection between the IC socket 1 and the connect board 7 is established through the sub-socket board 3, the terminal connector 4 and the socket board 6 when the connect board 7 are mounted on the socket board 6.

The other ends of the connect board 7 are mounted on a performance board 9 which is placed on the test head (not shown) of the semiconductor test system. The connect pins on the connect board 7 are inserted in through holes of the performance board 9. Thus the electric connection between the IC device to be tested which will be inserted in the IC socket 1 and the performance board 9 will be established when the test tray is placed over the IC device interface units of the present invention.

A board space 8 mechanically connects the performance board 9 and socket board 6 through a support frame 17. The support frame 17 also provides an electrical common ground for the IC device interface units. The board spacer 28 also functions to prevent a dry air escaping therefrom. The dry air is provided in the board space 28 to keep the atmosphere of the IC devices in low humidity when the IC device under test is evaluated under the low and high temperature environment formed by an automatic test handler (not shown) which transfers the IC devices on the test tray to the IC device interface units. The board spacer 8 is decreased in height for the limitation of the relative positioning relation between IC device interface units and the test handler.

FIGS. 2A–2B show an example of modification of the present invention. As noted above, the upper contact leads of terminal connecter 4 may protrude from the upper surface of the sub-socket board 3 as shown in FIG. 2A. To avoid any contacts by the contact leads with the IC socket 1, the socket spacer 2 is provided in FIGS. 1B–1C.

In FIG. 2B, upper contact leads of a terminal connector 22 are shortened so that the contact leads will not touch and interfere with the IC socket 1 at the upper surface of the sub-socket board 3 when the terminal connector 22 is inserted in the sub-socket board 3. In this arrangement, the socket spacer 2 can be eliminated.

FIGS. 3A–3B show another modification of the present invention. As noted above, the standard type IC sockets are preferably used in the present invention as shown in FIG. 3A. However, as long as the outer size of the IC socket is the same as the standard one, a different IC socket can be used in the interface unit of the present invention.

In FIG. 3B, a dent is provided at the bottom of an IC socket 23 so that interference to the IC socket 23 will not occur when the upper contact leads of the terminal connecter 4 are projected from the upper surface of the sub-socket board 3. Hence the terminal can escape in the space formed by the dent. In this arrangement also, the socket spacer 2 can be eliminated.

As has been foregoing, according to the present invention, two IC sockets can be positioned in the same area size as the conventional IC device interface unit. Thus, the unit structure for IC device interface of the present invention can increase the number of IC devices to be tested at the same time. As a result, the test efficiency in the semiconductor device testing is remarkably improved.

Further, since the IC device interface unit structure of the present invention is assembled as a unit, it is easily replaceable when changing the kinds of IC devices to be tested. The IC device interface unit structure of the present invention utilizes the standard sized IC sockets available in the market. Therefore, other parts of the semiconductor test system can remain unchanged while increasing the test efficiency.

Since the IC device interface unit of the present invention improves the density of the IC sockets by two times, the overall size of the interface unit is unaffected by this improvement. The unit structure for IC device interface of the present invention can handle 64 IC devices at the same time with 25 mm pitch compared to 32 devices with 50 mm pitch in the conventional technology.

What is claimed is:

1. An IC device interface unit for providing an electric connection between a test head of a semiconductor test system with IC devices to be tested carried by a test tray, comprising:

a pair of IC sockets for receiving IC devices to be tested, said IC sockets having a standard size defined in the industry;

a sub-socket board for mounting said IC sockets on one surface by receiving contact leads projected from said IC sockets;

a pair of terminal connectors to be mounted on the other surface of said sub-socket board, said terminal connectors having contact leads at both ends and one ends of which being connected to said sub-socket board;

a socket board for receiving other ends of said terminal connector at one surface of said socket board;

a pair of connect boards to be electrically connected to other surface of said socket board, said connect boards having contact leads at both ends and one ends of which being connected to said socket board and the other ends of which being connected to a performance board of said test head; and a sub-socket board spacer positioned between said sub-socket board and said socket board for providing a space for said terminal connector.

2. The IC device interface unit as defined in claim 1, further includes a socket spacer arranged between said IC sockets and said sub-socket board for providing a space for upper ends of contact leads of said terminal connector when said terminal connector is mounted on said sub-socket board.

3. The IC device interface unit as defined in claim 1, further includes a board spacer arranged between said socket board and said performance board for providing a space for storing a dry air to maintain a predetermined humidity level for said IC device to be tested.

4. The IC device interface unit as defined in claim 1, further includes pin connectors attached on said sub-socket board to accept said contact leads of said IC socket.

5. The IC device interface unit as defined in claim 1, further includes pin connectors attached on said socket board to accept said contact leads of said terminal connector.

6. The IC device interface unit as defined in claim 1, wherein said sub-socket board is provided with a plurality of conductive lands each of which includes a through hole to receive said contact lead of said IC socket or said contact lead of said terminal connector.

7. The IC device interface unit as defined in claim 1, wherein said socket board is provided with a plurality of conductive lands each of which includes a through hole to receive said contact lead of said terminal connector or said contact lead of said connect board.

8. The IC device interface unit as defined in claim 1, wherein upper ends of said contact leads of said terminal connector are decreased in length such that said upper ends will not project from an upper surface of said sub-socket board.

9. The IC device interface unit as defined in claim 1, wherein a groove is provided at the bottom of each of said IC socket for forming a space for upper ends of said contact leads of said terminal connector projected from an upper surface of said sub-socket board.

* * * * *